(12) United States Patent
Leegate et al.

(10) Patent No.: US 8,071,892 B2
(45) Date of Patent: Dec. 6, 2011

(54) ELECTROMAGNETIC ISOLATION CHAMBER FOR ACCURATELY MANIPULATING DEVICES THEREIN

(76) Inventors: Gary Conrad Leegate, St. Petersberg, FL (US); Roland Stephen Leegate, Vero Beach, FL (US)

( * ) Notice: Subject to any disclaimer, the term of this patent is extended or adjusted under 35 U.S.C. 154(b) by 359 days.

(21) Appl. No.: 12/462,481

(22) Filed: Aug. 4, 2009

(65) Prior Publication Data
US 2011/0031009 A1 Feb. 10, 2011

(51) Int. Cl.
*H05K 9/00* (2006.01)
*G01R 31/00* (2006.01)

(52) U.S. Cl. .......... 174/380; 174/382; 324/750.27; 361/818

(58) Field of Classification Search .......... 174/379, 174/380, 382; 250/506.1; 73/864.74; 324/750.27; 361/818
See application file for complete search history.

(56) References Cited

U.S. PATENT DOCUMENTS

| | | | | |
|---|---|---|---|---|
| 4,115,656 A | * | 9/1978 | Aitel | 174/380 |
| 4,156,146 A | * | 5/1979 | Imai et al. | 250/516.1 |
| 5,099,135 A | * | 3/1992 | Gemmill | 250/516.1 |
| 5,136,119 A | * | 8/1992 | Leyland | 174/379 |
| 5,262,578 A | * | 11/1993 | Hall | 588/249 |
| 5,316,733 A | * | 5/1994 | Rune et al. | 422/565 |
| 5,594,200 A | | 1/1997 | Ramsey | |
| 6,255,830 B1 | * | 7/2001 | Rollin et al. | 324/627 |
| 6,469,495 B1 | * | 10/2002 | Boswell et al. | 324/750.27 |
| 6,968,993 B1 | * | 11/2005 | Russell | 232/17 |
| 7,388,160 B2 | * | 6/2008 | Mok et al. | 174/382 |
| 7,589,979 B2 | * | 9/2009 | Chang et al. | 361/818 |
| 7,772,503 B2 | * | 8/2010 | Ginanneschi | 174/378 |
| 2003/0057131 A1 | * | 3/2003 | Diaferia | 206/719 |
| 2003/0070404 A1 | * | 4/2003 | Calabrese | 55/385.2 |
| 2003/0076011 A1 | * | 4/2003 | Brownfiel, Jr. | 312/1 |
| 2003/0103881 A1 | * | 6/2003 | Lane et al. | 422/292 |
| 2005/0231307 A1 | | 10/2005 | Yang | |
| 2008/0265908 A1 | * | 10/2008 | Hsieh et al. | 324/555 |
| 2009/0146862 A1 | * | 6/2009 | Malone | 342/1 |
| 2009/0149141 A1 | * | 6/2009 | Mao et al. | 455/115.3 |

FOREIGN PATENT DOCUMENTS

JP 2006-153841 * 6/2006

* cited by examiner

*Primary Examiner* — Hung Ngo
(74) *Attorney, Agent, or Firm* — Robert Nathans

(57) ABSTRACT

An EMI shielded isolation chamber is provided, having an integral manipulator for manipulating electronic devices such as cell phones within the chamber, whereby a probe can be precisely positioned to selectively and directly actuate controls, switches, and keypads upon the devices anywhere in the chamber upon rotation of a probe tip. Extensible collapsible shielding boots are coupled between wall portions of the shielded chamber, adjacent a wall mounted manipulator support gimbal, and forward or rearward portions of the mechanical manipulator for preventing EMI signals from entering or leaving the shielded chamber. Alternatively, the gimbal constitutes the shielding device whereby a metallic hollow ball, slidably and rotatably supporting and containing the elongated manipulator, is mechanically biased snugly against a concave metallic member to block radiation from entering or leaving the shielded chamber. The probe tip is self-illuminated by an LED, thus providing illumination for the portion of the device being actuated.

25 Claims, 3 Drawing Sheets

ELECTROMAGNETIC ISOLATION CHAMBER FOR ACCURATELY MANIPULATING DEVICES THEREIN

BACKGROUND OF THE INVENTION

The present invention relates to the field of electromagnetic isolation chambers.

U.S. Pat. No. 5,594,200 issued to Ramsey in January 1997, incorporated by reference herein, discloses a fully electromagnetic interference (EMI) shielded "glove box" for containing devices therein under test, such devices including portable cellular telephones, notebook computer modems, portable pagers and the like. The walls of the EMI isolation chamber have shielding to prevent outside EMI, typically radio frequency (RF) signals from penetrating the chamber containing the devices under test which would otherwise interfere with the testing, tuning and repair of the devices within the chamber, isolated from outside electro-magnetic interference (EMI). The Ramsey chamber has been designated by him as a "glove box" since the hands of the user are passed through the flexible and deformable EMI shield in the manner of a hand being inserted into a glove, to permit tactile feel and manipulation of the devices within the chamber, while the shielding maintains isolation of the devices with respect to outside EMI.

BRIEF SUMMARY OF PREFERRED EMBODIMENTS OF THE INVENTION

The inventors has discovered two problems with the Ramsey device of U.S. Pat. No. 5,594,200. The first problem being that the metallic shielding glove is present between the fingers of the user within the glove, or the end of a briefly mentioned and undisclosed sleeve, pressing against the inside of the glove. This means that it is often difficult to actuate portions of the device under test, e.g. typically tiny keyboard buttons on cell phones. The keyboard buttons of such devices are typically quite small relative to the fingers of many persons attempting to actuate them with their fingers in the glove of the Ramsey device and thus accurate selective actuation of such keyboard buttons becomes difficult and tedious.

The second problem is that the size of the Ramsey device made necessary to accommodate one or more gloved hands within the "glove box", limits the portability of the device, rendering it somewhat impractical and inconvenient for use in field situations where it might need to be carried to the point of use outside the laboratory environment, to be either hand-carried by an individual or transported within the relatively small confines of the passenger cabin or trunk of vehicles (such as police or military patrol cars).

In accordance with first and second embodiments of the invention, a flexible EMI shielded boot is positioned around either the inner or outer portion of the manipulator rod to EMI isolate the interior of the chamber from the outside, which eliminates the undesired need to position a shielding screen between the operator's fingers and the device being manipulated. This goal can also be obtained in accordance with a third embodiment of the invention, by configuring the gimbal itself as an EMI seal.

An elongated manipulator rod, integral with the shielded chamber, is supported by a gimbal within a wall portion of the chamber, and its probe head can thus be positioned virtually anywhere within the chamber where a device button to be actuated can be located. The elongated manipulator can also be rotated within the gimbal so that the tip of the probe head can "swoop down" over a selected controls, switches, and keypads on a electronic device within the chamber to accurately contact and depress it. The probe tip provides illumination for position referencing either by (a) internal self-illumination of the probe tip itself, or (b) a directed light source fitted near the probe tip that causes a beam of light to be projected upon the neighborhood of the targeted controls, switches, and keypads—both of these variations designed to ease the process and reduce the eyestrain of the operator manually actuating the manipulator rod portion external of the chamber.

BRIEF DESCRIPTION OF THE DRAWINGS

Other features and advantages of the invention will become more apparent upon further reading of the specification in conjunction with the drawings in which:

FIG. 2a is a partial end view of the boot attachment device; and

DETAILED DESCRIPTION OF PREFERRED EMBODIMENTS OF THE INVENTION

Figure 1:
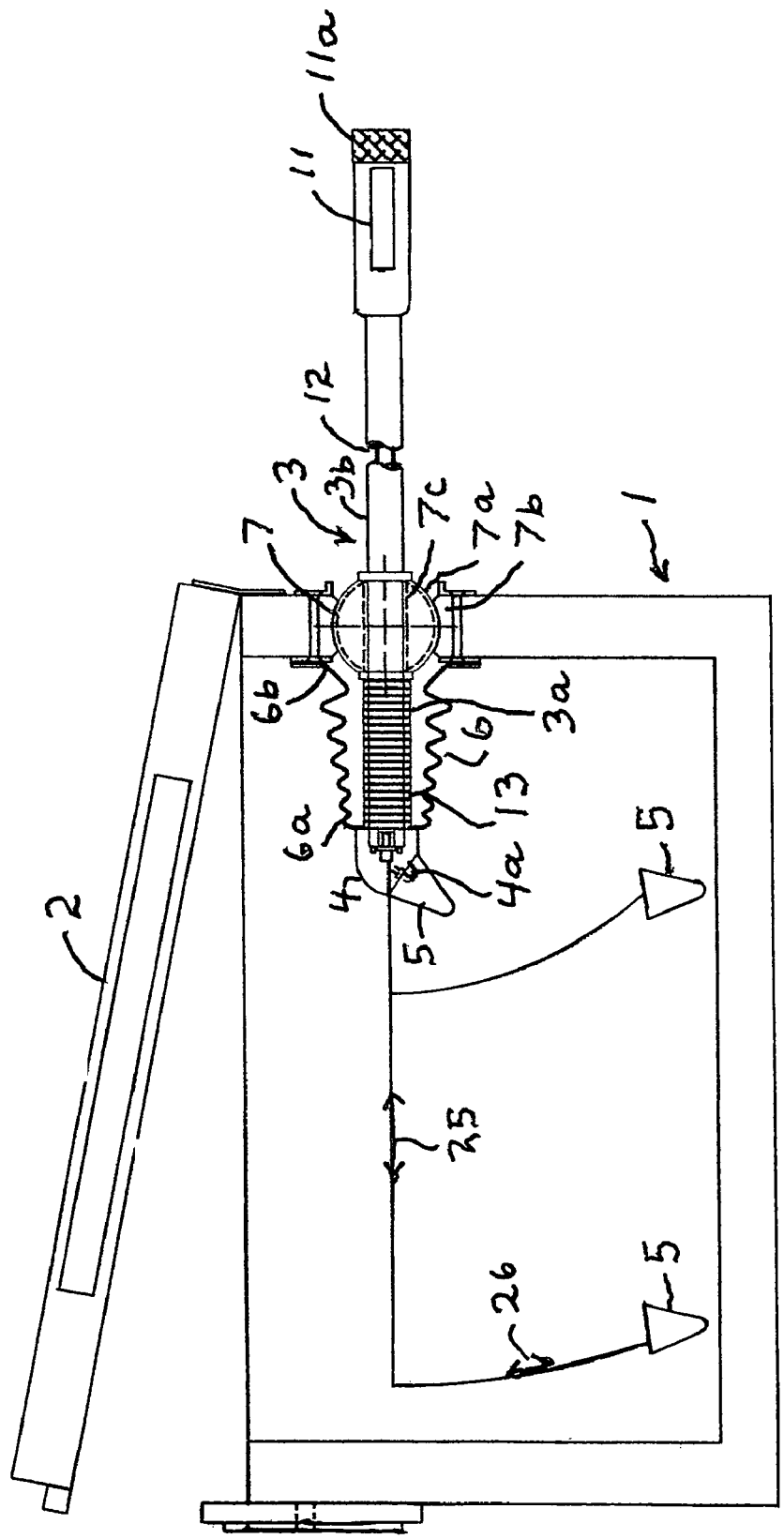
FIG. 1 illustrates a first embodiment of the invention.

Referring now to FIG. 1, an EMI shielded manipulating chamber 1 supports a shielded mechanical manipulator 3, that provides a significantly smaller, lighter, more portable, less expensive, higher precision device than prior art designs. The shielded chamber 1 is well known in the art as a Faraday Box. This type of box facilitates storage and manipulation of electronic devices such as cell phones, personal data assistants (PDAs), MP3-type music players, particularly for electronic data forensics applications. Such forensic applications include electronic data evidence collection, security, custody, and electronic data access/extraction in an environment shielded from contamination by electromagnetic interference (EMI), typically radio frequency (RF) signals, with the added feature of preventing unwanted and potentially unsafe radio frequency transmissions radiated from the electronic device to the outside of the shielded manipulating chamber.

The shielded chamber 1, shown in FIG. 1, has a hinged and locking cover or door 2 having a clear viewing window for viewing the chamber interior that is shielded and sealed from ingress or egress of electromagnetic (EMI) radiation to and from the shielded manipulating chamber. The chamber is fitted with an integral, built-in extensible, retractable, and rotatable mechanical manipulator 3, capable of accessing the majority of the interior of the chamber volume and therefore the controls, switches, and keypads of any electronic devices fixed therein, such mechanical manipulator being fitted with a probe head 4 and an angularly displaced probe tip 5, along with an extensible, retractable, and rotatable shielding cover or boot 6 of electrically conductive and EMI-shielding material which is conductively connected to the articulating portion 6a of the mechanical manipulator and the access aperture 7 in the chamber wall so as to provide complete EMI shielding of the mechanical manipulator within the walls of the chamber. This arrangement permits an operator, from outside the chamber, to directly and precisely manipulate the controls, switches, and keypads of an electronic device within the chamber, without the insertion of human hands or limbs or unattached, sundry tools into the chamber volume.

More specifically, a movable mechanical manipulator 3 is provided for manipulating the devices within the shielded chamber and having manipulator support means 7, coupled to a wall portion of the shielded chamber, for supporting a first manipulator portion 3a positioned internally with respect to the shielded chamber for directly contacting and manipulating selected portions of the devices within the shielded chamber and a second manipulator portion (or handle) 3b positioned externally with respect to the shielded chamber for moving the first manipulator portion. EMI extensible and collapsible shielding means 6, in the form of a shielding boot, is coupled between the wall portion 6b and a forward portion 6a of the first manipulator portion of the shielded chamber as shown in FIG. 1.

The manipulator support means 7 includes a spherical gimbal member 7a, a spherically concave shaped gimbal race bearing 7b, and a though hole (orifice) 7c for slidably retaining the first portion of the manipulator rod as shown in FIG. 1.

Thus, the extensible and collapsible shielding means preferably in the form of a flexible boot of EMI shielding material surrounds the first manipulator portion for blocking external EMI signals from entering the shielded chamber as the first portion of the mechanical manipulator slides back and forth within the orifice 7c in the gimbal of the support means and tilts in orthogonal XY directions in response to actuation of the second external manipulator portion. This action is indicated by double headed arrow 26. The sliding action in gimbal orifice 7c moves the probe head in the Z direction, orthogonal to the tilting action of the probe head in orthogonal X and Y directions as indicated by double headed arrow 25.

The manipulator support gimbal means rotatably supports the mechanical manipulator, within gimbal orifice 7c, enabling the probe head 4 and the probe tip 5 coupled thereto to be rotated within the shielded chamber for "swooping down" and directly contacting selected and often tiny controls, switches, and keypads of the devices thereof.

The probe tip is preferably configured as a tapering, conical structure enabling accurate pressing against selected controls, switches, and keypads on the electronic devices under test via the tapered end.

As shown in FIG. 1, the probe tip 5 may have an illumination device embedded therein such as an LED 4a for self-illumination of the probe tip. Alternately, the probe head may have fitted to it in close proximity an externally-mounted illumination device, such as an LED, which directly illuminates portions of the devices in the vicinity of the probe tip, for improving precise targeting of selected controls, switches, and keypads on the devices under test and thus easing eye strain. In both variations, the probe tip may be made of light transmitting material such as white or translucent plastic to illuminate the probe tip, and to transmit the light beam from the LED even more directly upon the selected device switches via the probe tip.

The LED is preferably connected to a battery 11 in the second portion of the manipulator or handle portion via leads 12 and an on/off switch, not shown, may be located in the end of the handle. Access to the battery is provided by screw-cap 11a. The LED may be electrically coupled to wires 12 via the same device for mechanically and rotatably coupling internal manipulator rod portion 3a to the probe head. More specifically, the manipulator rod mates mechanically with the probe head while simultaneously engaging co-axial electrical contacts to provide battery power to the LED in the probe head. Extension spring 13 surrounds the first manipulator portion and is coupled between the gimbal and the probe head as shown. The spring mechanically biases the probe head in the retracted position shown to establish a home based manipulator position.

Figure 2:
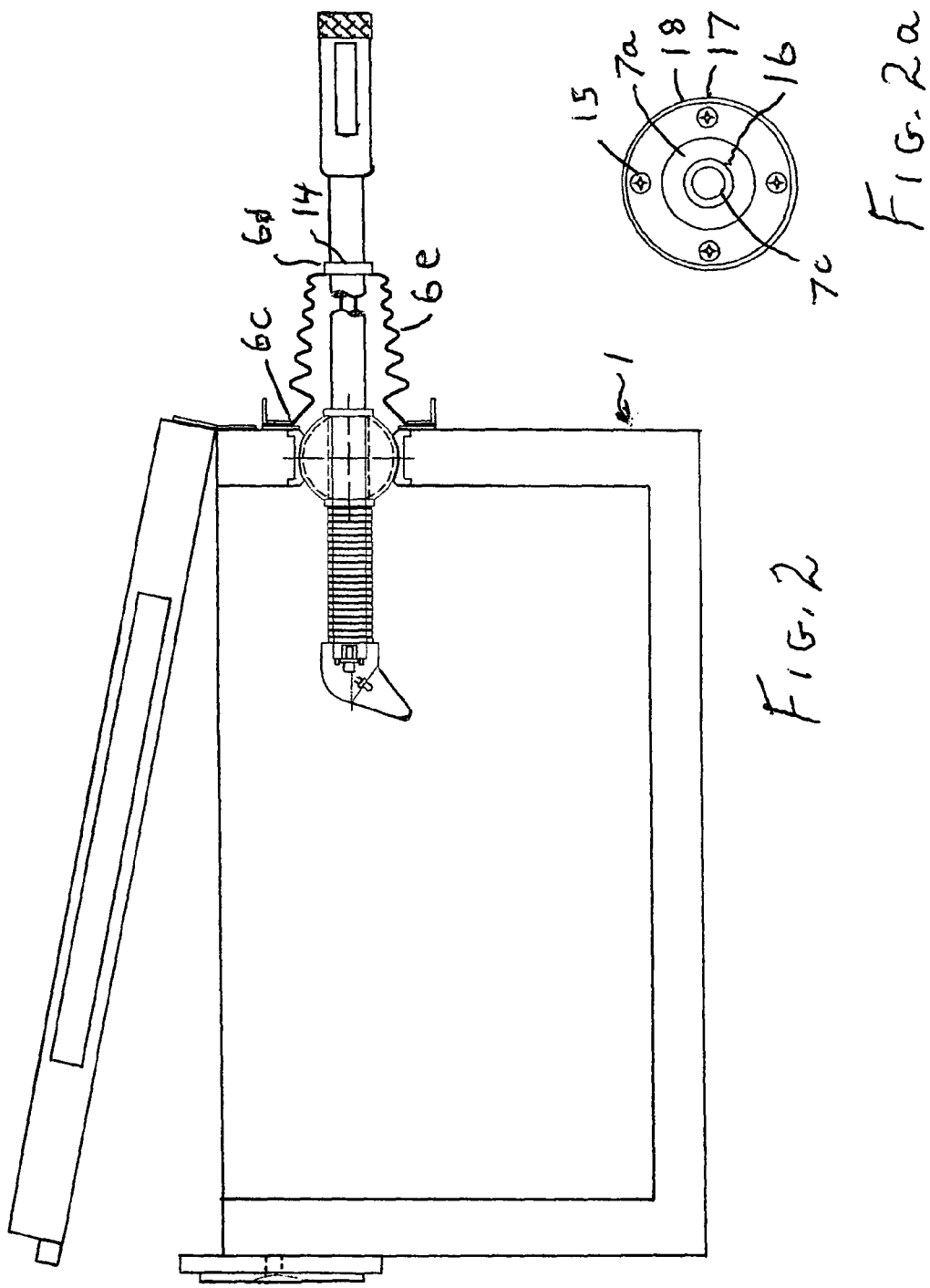
FIG. 2 illustrates a portion of FIG. 1, illustrating a second embodiment of the invention.

FIG. 2 shows an alternative arrangement of the aforesaid shielding boot 6, wherein the shielding boot 6e is coupled between wall portion 6c and a rearward portion 6d of the second external manipulator portion of the shielded chamber. A threaded collar 14 upon portion 6d is permanently mounted to the shielding boot, to temporarily attach the boot to the manipulating rod.

FIG. 2a is a partial side view of FIG. 2 showing an interface collar which is a rigid ring 15 permanently attached to the wall portion adjacent the gimbal at 6c as shown. A support collar 16 is provided for slidably supporting the manipulator rod in gimbal orifice portion 7c within the spherical gimbal ball 7a. The FIG. 2a unit couples the boot to the wall portion at 6c by screws 15. A similar unit, except for a threaded shielding cap attachment portion 18, is also used to couple the shielding boot 6 to wall portion 6b as shown in FIG. 1.

Referring to FIG. 2, the shielding boot threaded collar 14 attached to the boot, is unscrewed from the manipulator rod to allow for removal of the manipulator rod if required for storage or shipment of the entire apparatus to another location. The external boot can remain permanently attached to the box, and to collapse onto itself if the manipulating rod has been removed.

After removal of the manipulating rod, a shielding member can be detachably mounted over an apertured external wall portion of the shielded chamber. More specifically, a metallic cap can be screwed on a threaded wall portion 18 of the boot attachment member shown in FIG. 2a, to continue shielding of the devices that may be stored within the apparatus. This continued shielding of the chamber is useful in preserving the states of the devices for subsequent use, for example in criminal or civil litigation.

Figure 3:
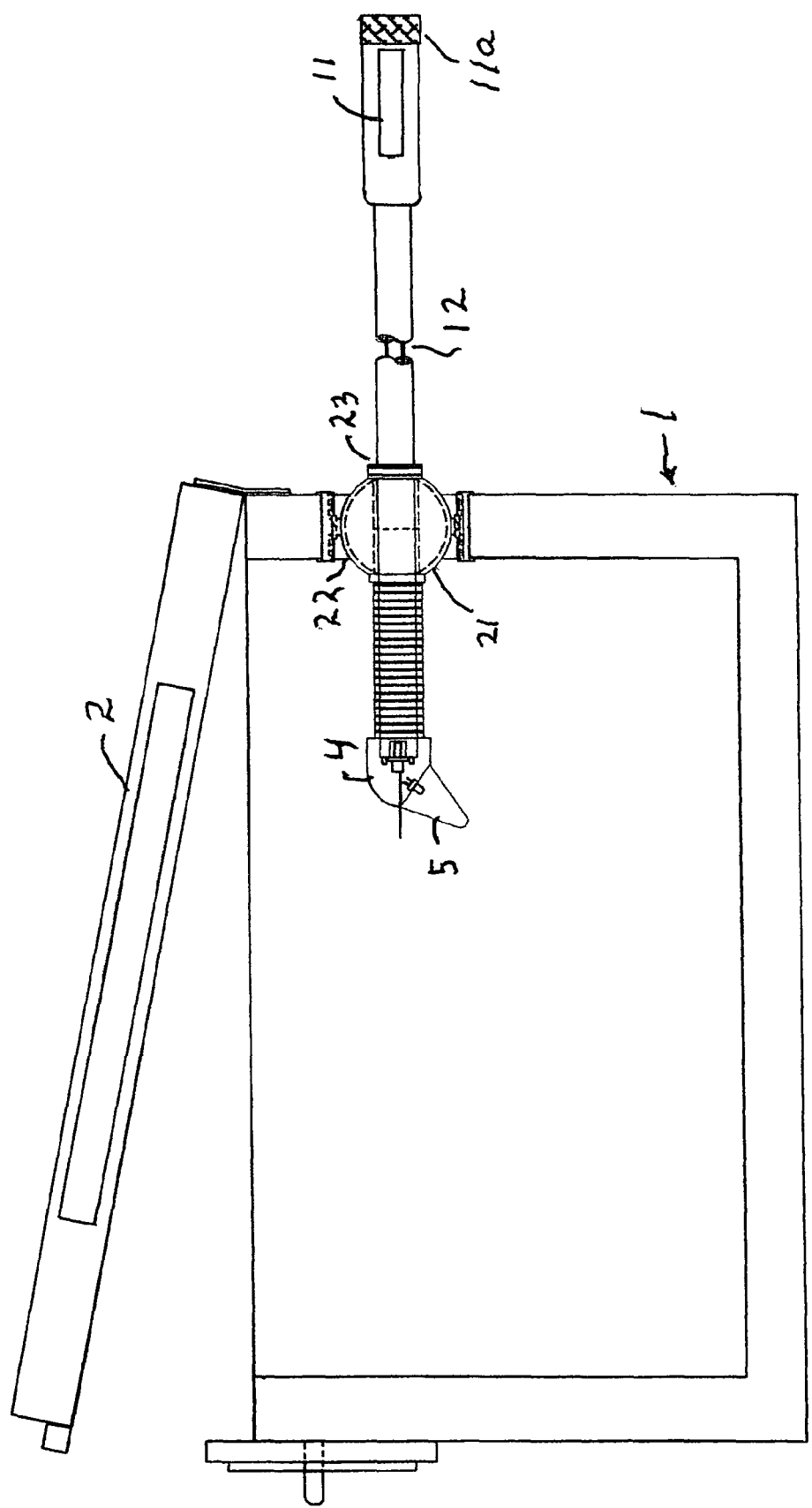
FIG. 3 illustrates a third embodiment of the invention wherein the shielding boots are replaced by a gimbal EMI isolation sealing mechanism.

An alternative embodiment of the invention is shown in FIG. 3, not employing the shielding boots of FIGS. 1 and 2, wherein the elongated manipulator support means includes a metallic hollow ball 21 containing a portion of the movable mechanical manipulator rod, the metallic hollow ball being mechanically biased snugly against a concave spring loaded metallic member 22, for isolating interior portions of the shielded chamber from EMI radiation external of the shielded chamber. The threaded interface location for the aforesaid shielding cap is shown at portion 23.

The walls and/or floor of the chamber opposite of the shielded viewing window may be covered with adhesive-backed Velcro® hook and loop material or equivalent, such that the bottom, non-active surface of the electronic device can be made to temporarily attach to the walls and/or floor of the manipulating chamber by addition of a mating self-adhesive peel-and-stick hook or pile material provided as an accessory to the manipulating chamber, such mating materials allowing the electronic device with its keypads and controls exposed to the chamber viewing window and available to the mechanical manipulator, to be firmly, fixedly but removably attached to the walls and/or floor of the manipulating chamber in order to hold the electronic device steady within the chamber to facilitate manipulation by the mechanical manipulator.

The manipulating chamber may further provide suitable EMI-shielded electronic data and power connectors if needed with interfaces internal and external to the manipulating chamber so that the electronic device to be manipulated within the chamber may be connected to external electronic data collection and/or power sources, via standard and customized interface cables, to load or extract data, execute commands, and/or provide external power to the electronic device within the manipulating chamber.

While the invention has been described in connection with preferred embodiments, the description is not intended to limit the scope of the invention to the particular forms set forth, but on the contrary, it is intended to cover such alternatives, modifications, and equivalents as may be included within the spirit and scope of the invention as indicated by the language of the appended claims.

What is claimed is:

1. An EMI shielded chamber for containing devices to be tested or manipulated within the shielded chamber having
   (a) a movable mechanical manipulator for manipulating said devices within said shielded chamber and having manipulator support means, coupled to a wall portion of said shielded chamber, for supporting a first manipulator portion positioned internally with respect to said shielded chamber for directly contacting selected portions of said devices within said shielded chamber and a second manipulator portion positioned externally with respect to said shielded chamber for moving said first manipulator portion; and
   (b) an extensible and collapsible EMI shielding means coupled between said wall portion of said shielded chamber and said movable mechanical manipulator for preventing EMI signals from entering said shielded chamber.

2. The shielded chamber of claim 1 wherein said extensible and collapsible shielding means surrounds an internal portion of the first manipulator portion for blocking external EMI signals from entering the shielded chamber as said mechanical manipulator slides back and forth within said support means and through said wall portion and tilts in orthogonal directions in response to actuation of said second manipulator portion.

3. The shielded chamber of claim 2 wherein said support means is a gimbal permitting a probe head of said first manipulator portion to move in any direction within said shielded chamber for directly contacting selected portions of said devices within said shielded chamber.

4. The shielded chamber of claim 3 wherein said probe head has an illumination device for directly illuminating portions of said devices in the vicinity of said probe head.

5. The shielded chamber of claim 1 wherein said extensible and collapsible shielding means surrounds an external portion of the first mechanical manipulator portion for blocking external EMI signals from entering the shielded chamber as the mechanical manipulator slides back and forth within said support means and through said wall portion and tilts in orthogonal directions in response to actuation of said second manipulator portion.

6. The shielded chamber of claim 5 wherein said support means is a gimbal permitting a probe head of said first manipulator portion to move in any direction within said shielded chamber for directly contacting selected portions of said devices within said shielded chamber.

7. The shielded chamber of claim 6 wherein said probe head has an illumination device for directly illuminating portions of said devices in the vicinity of said probe head.

8. The shielded chamber of claim 1 wherein said support means is a gimbal permitting a probe head of said first manipulator portion to move in any direction within said shielded chamber for directly contacting selected portions of said devices within said shielded chamber.

9. The shielded chamber of claim 8 wherein said probe head has an illumination device for directly illuminating portions of said devices in the vicinity of said probe head.

10. The shielded chamber of claim 8 wherein said manipulator support means rotatably supports said mechanical manipulator enabling said probe head to be rotated within said shielded chamber for directly contacting selected portions of said devices.

11. The shielded chamber of claim 1 including a shielding member detachably mounted over an apertured external wall portion of said shielded chamber to continue shielding of interior portions of the chamber having said devices therein, upon storage or transportation of the shielded chamber.

12. An EMI shielded chamber for containing devices to be manipulated therein having
    (a) a movable mechanical manipulator for manipulating said devices within said shielded chamber and having manipulator support gimbal, coupled to a wall portion of said shielded chamber, for supporting a first elongated manipulator portion, slidably movable with respect to said shielded chamber, and having a probe head for directly contacting selected portions of said devices within said shielded chamber, and for supporting a second elongated manipulator portion positioned externally with respect to said shielded chamber for enabling actuation of said first manipulator portion and the probe head thereon upon actuation of said second manipulator portion, and wherein said manipulator support gimbal is configured to permit the probe head of said first manipulating portion to be moved in any of three orthogonal direction within said chamber for enabling said probe head to directly contact selected portions of said devices within said shielded chamber and
    (b) an extensible and collapsible EMI shielding means coupled between said wall portion of said shielded chamber and a portion of said mechanical manipulator for preventing EMI signals from entering said shielded chamber and
    (c) wherein said extendable and collapsible shielding means takes the form of a boot of EMI shielding material surrounding a manipulator portion.

13. The shielded chamber of claim 12 wherein said gimbal rotatably supports said mechanical manipulator enabling said probe head to be rotated within said shielded chamber for directly actuating portions of said devices.

14. The shielded chamber of claim 13 wherein said probe head has an illumination device for directly illuminating portions of said devices in the vicinity of said probe head.

15. The shielded chamber of claim 12 wherein said probe head has an illumination device for directly illuminating portions of said devices in the vicinity of said probe head.

16. The shielded chamber of claim 15 wherein a battery is positioned within a compartment of the second manipulator portion and is electrically coupled to said illumination device.

17. The shielded chamber of claim 15 wherein said illumination device comprises a light transmitting tapered probe tip for directing a narrow light beam through said probe tip precisely upon selected portions of said devices.

18. The shielded chamber of claim 12 including a shielding member detachably mounted over an apertured external wall portion of said shielded chamber to continue shielding of interior portions of the chamber having said devices therein, upon storage or transportation of the shielded chamber.

19. An EMI shielded chamber for containing devices to be tested or manipulated within said shielded chamber having
    (a) a movable mechanical manipulator for manipulating said devices within said shielded chamber;
    (b) manipulator support means coupled to a wall portion of said shielded chamber, for supporting a first manipulator portion positioned internally with respect to said shielded chamber for directly contacting said devices within said shielded chamber and a second manipulator portion positioned externally with respect to said shielded chamber for moving said first manipulator portion; and (c) wherein said manipulator support means includes a rotatable metallic hollow ball containing a portion of said movable mechanical manipulator, said rotatable metallic hollow ball being mechanically biased snugly against a concave metallic member, for isolating interior portions of said shielded chamber from EMI radiation external of said shielded chamber.

20. The shielded chamber of claim 19 wherein said manipulator support means rotatably supports a portion of said mechanical manipulator, enabling a probe head at a terminal portion of the mechanical manipulator to be rotated within said shielded chamber for directly contacting portions of said devices.

21. The shielded chamber of claim 19 wherein a probe head positioned upon said first manipulator portion has an illumination device for directly illuminating portions of said devices in the vicinity of said probe head.

22. The shielded chamber of claim 21 wherein said illumination device has a light transmitting tapered probe tip for aiding in precise actuation of selected portions of said devices within said shielded chamber upon rotation of said mechanical manipulator.

23. The shielded chamber of claim 22 wherein a battery is positioned within a compartment of the second manipulator portion and is electrically coupled to said illumination device.

24. The shielded chamber of claim 21 wherein a battery is positioned within a compartment of the second manipulator portion and is electrically coupled to said illumination device.

25. The shielded chamber of claim 19 including a shielding member detachably mounted over an apertured external wall portion of said shielded chamber to continue shielding of interior portions of the chamber having said devices therein, upon storage or transportation of the shielded chamber.

* * * * *